(12) United States Patent
Katou et al.

(10) Patent No.: US 9,842,924 B2
(45) Date of Patent: Dec. 12, 2017

(54) SEMICONDUCTOR DEVICE HAVING AN ELECTRODE THAT IS IN A PERIPHERAL TRENCH REGION AND AT A SAME POTENTIAL AS A SOURCE ELECTRODE

(71) Applicant: KABUSHIKI KAISHA TOSHIBA, Tokyo (JP)

(72) Inventors: Hiroaki Katou, Nonoichi Ishikawa (JP); Toshifumi Nishiguchi, Hakusan Ishikawa (JP); Saya Shimomura, Komatsu Ishikawa (JP); Akio Suzuki, Nonoichi Ishikawa (JP); Kentaro Ichinoseki, Nonoichi Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/247,913

(22) Filed: Aug. 25, 2016

(65) Prior Publication Data
US 2017/0222038 A1    Aug. 3, 2017

(30) Foreign Application Priority Data
Feb. 1, 2016 (JP) ................................. 2016-017344

(51) Int. Cl.
*H01L 29/66* (2006.01)
*H01L 29/78* (2006.01)
(Continued)

(52) U.S. Cl.
CPC .... *H01L 29/7813* (2013.01); *H01L 21/28114* (2013.01); *H01L 29/407* (2013.01); *H01L 29/42376* (2013.01); *H01L 29/7811* (2013.01)

(58) Field of Classification Search
CPC ............... H01L 29/1095; H01L 29/407; H01L 29/41741; H01L 29/4236; H01L 29/42376;
(Continued)

(56) References Cited

U.S. PATENT DOCUMENTS 7,183,610 B2    2/2007   Pattanayak et al.
8,884,362 B2   11/2014   Matsuoka et al.
(Continued)

FOREIGN PATENT DOCUMENTS

JP    4150496 B2    9/2008
JP    5616874 B2   10/2014

*Primary Examiner* — Shahed Ahmed
(74) *Attorney, Agent, or Firm* — Patterson & Sheridan, LLP

(57) ABSTRACT

A semiconductor device includes a layer having first and second surfaces, a first region including central and peripheral portions, and a second region on the first region. First trenches extend into the first surface and terminate within the first region in the central portion. Each first trench includes a first electrode and a gate electrode over the first electrode. The first and gate electrodes are spaced from the first and second regions by a first insulating layer. A second trench extends into the first surface and terminates within the first region in the peripheral portion. The second trench includes a second electrode and a third electrode over the second electrode. The second and third electrodes are spaced from the first and second regions by a second insulating layer. A fourth electrode overlies the first insulating layer in the central portion and the second insulating layer in the peripheral portion.

11 Claims, 15 Drawing Sheets

(51) Int. Cl.
*H01L 29/40* (2006.01)
*H01L 29/423* (2006.01)
*H01L 21/28* (2006.01)

(58) Field of Classification Search
CPC ........... H01L 29/66734; H01L 29/7813; H01L 29/42368; H01L 29/41766; H01L 21/28114; H01L 29/7811
USPC ........ 257/330, 335, 520; 438/133, 270, 361, 438/429
See application file for complete search history.

(56) References Cited

U.S. PATENT DOCUMENTS

| | | | |
|---|---|---|---|
| 9,184,261 B2 | 11/2015 | Kobayashi et al. | |
| 2003/0080379 A1* | 5/2003 | Oikawa | H01L 29/4236 257/331 |
| 2013/0146970 A1* | 6/2013 | Hirler | H01L 27/0255 257/334 |

* cited by examiner

SEMICONDUCTOR DEVICE HAVING AN ELECTRODE THAT IS IN A PERIPHERAL TRENCH REGION AND AT A SAME POTENTIAL AS A SOURCE ELECTRODE

CROSS-REFERENCE TO RELATED APPLICATION

This application is based upon and claims the benefit of priority from Japanese Patent Application No. 2016-017344, filed Feb. 1, 2016, the entire contents of which are incorporated herein by reference.

FIELD

Embodiments described herein relate generally to a semiconductor device.

BACKGROUND

A semiconductor device such as a metal oxide semiconductor field effect transistor (MOSFET) is used in applications such as power conversion. It is desired that the semiconductor device have high reliability.

DETAILED DESCRIPTION

Figure 1:
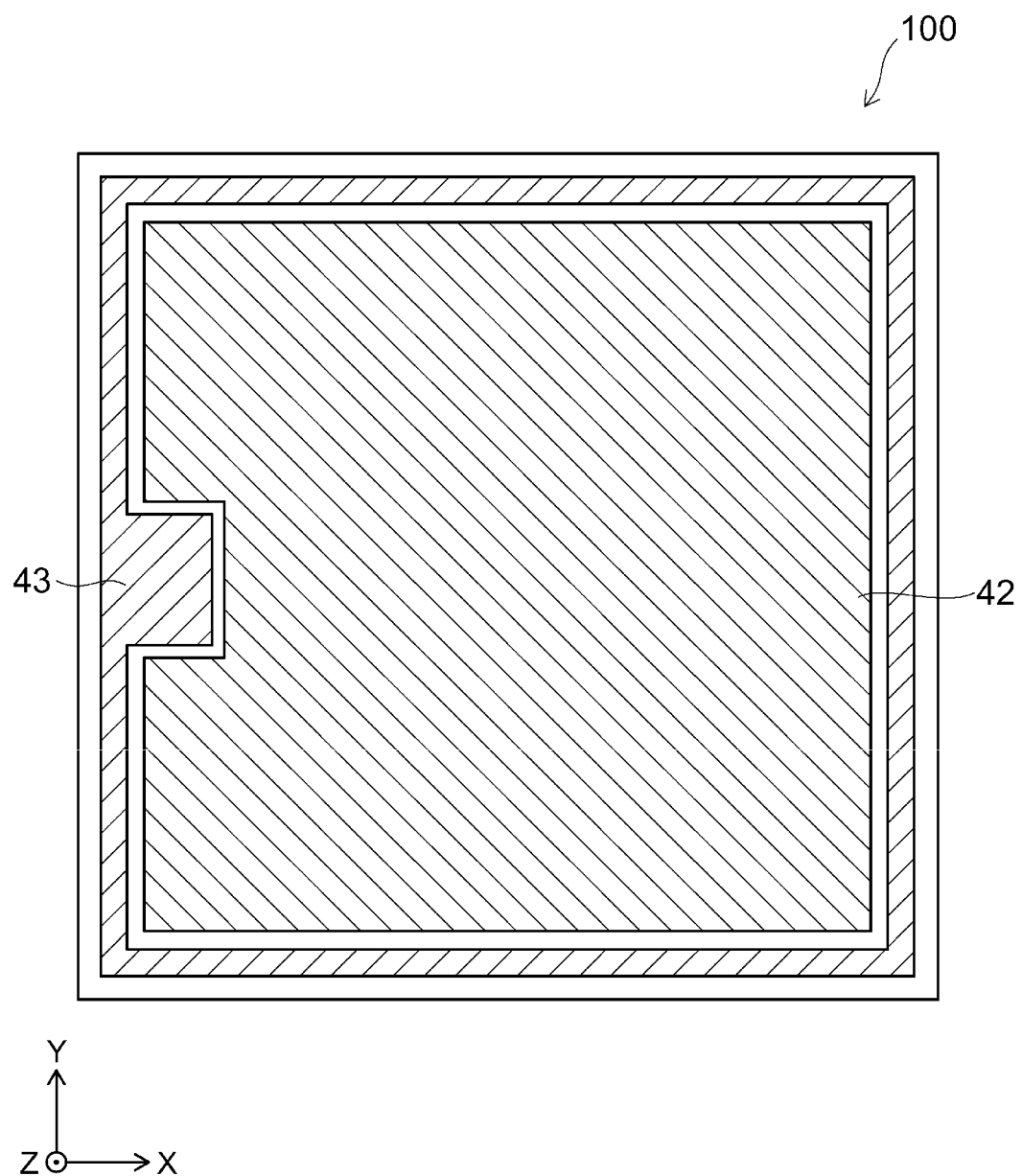
FIG. 1 is a plan view of a semiconductor device according to a first embodiment.

According to an embodiment, there is provided a semiconductor device with improved reliability.

According to one embodiment, there is provided a semiconductor device includes a semiconductor layer having a first surface and an opposed second surface, a first conductivity type first semiconductor region including a central portion and a peripheral portion, and a second conductivity type second semiconductor region selectively on the first semiconductor region in the central portion and the peripheral portion. A plurality of first trenches extend inwardly of the first surface, through the second semiconductor regions, and terminate within the first semiconductor region in the central portion. Each first trench includes a first insulating layer lining the walls of the first trench and extending outwardly thereof above the first surface, a first electrode in the first trench extending inwardly of the first semiconductor region and spaced therefrom by the first insulating layer, and a gate electrode over the first electrode and spaced from adjacent portions of the first semiconductor layer and the second semiconductor layer by the first insulating layer and covered by the first insulating layer. At least one second trench extends inwardly of the first surface through the second semiconductor region and terminates within the first semiconductor region in the peripheral portion. The second trench includes a second insulating layer lining the walls of the second trench and extending outwardly thereof above the first surface, a second electrode in the second trench extending inwardly of the first semiconductor region and spaced therefrom by the second insulating layer, and a third electrode over the second electrode and spaced from adjacent portions of the first semiconductor region and the second semiconductor region by the second insulating layer and covered by the second insulating layer. A fourth electrode overlies the first surface and the first insulating layer in the central portion and the first surface and the second insulating layer in the peripheral portion. The third electrode is electrically connected to the fourth electrode.

The drawings figures are schematic, and a relationship between a thickness or width of each portion and a ratio of sizes between each portion are not necessarily identical to those of an actual device. In addition, in some cases of describing the same elements, depending on the drawings, the dimensions or ratios may be differently illustrated.

In addition, herein, where the same reference numbers and symbols are given to the same or similar members already described the description thereof will not be repeated.

In the description in each embodiment, an XYZ orthogonal coordinate system is used. Two directions from a first region R1 to a second region R2 that are orthogonal to each other are respectively assumed to be an X direction (first direction) and a Y direction, and a direction orthogonal to the X direction and the Y direction is assumed to a Z direction (second direction).

Herein, indications $n^+$, $n^-$, $p^+$, and p represent a relative level of an impurity concentration in each conductive type. That is, the indication "+" means that the impurity concentration is relatively higher than a case without an indication "+" or that with an indication "−". The indication "−" means that the impurity concentration is relatively lower than a case without any indication of "+" or "−".

In each embodiments described below, each embodiment may be embodied by reversing the p-type and the n-type of each semiconductor region.

First Embodiment

An example of a semiconductor device of the first embodiment will be described with reference to FIG. 1 to FIG. 6.

Figure 2:
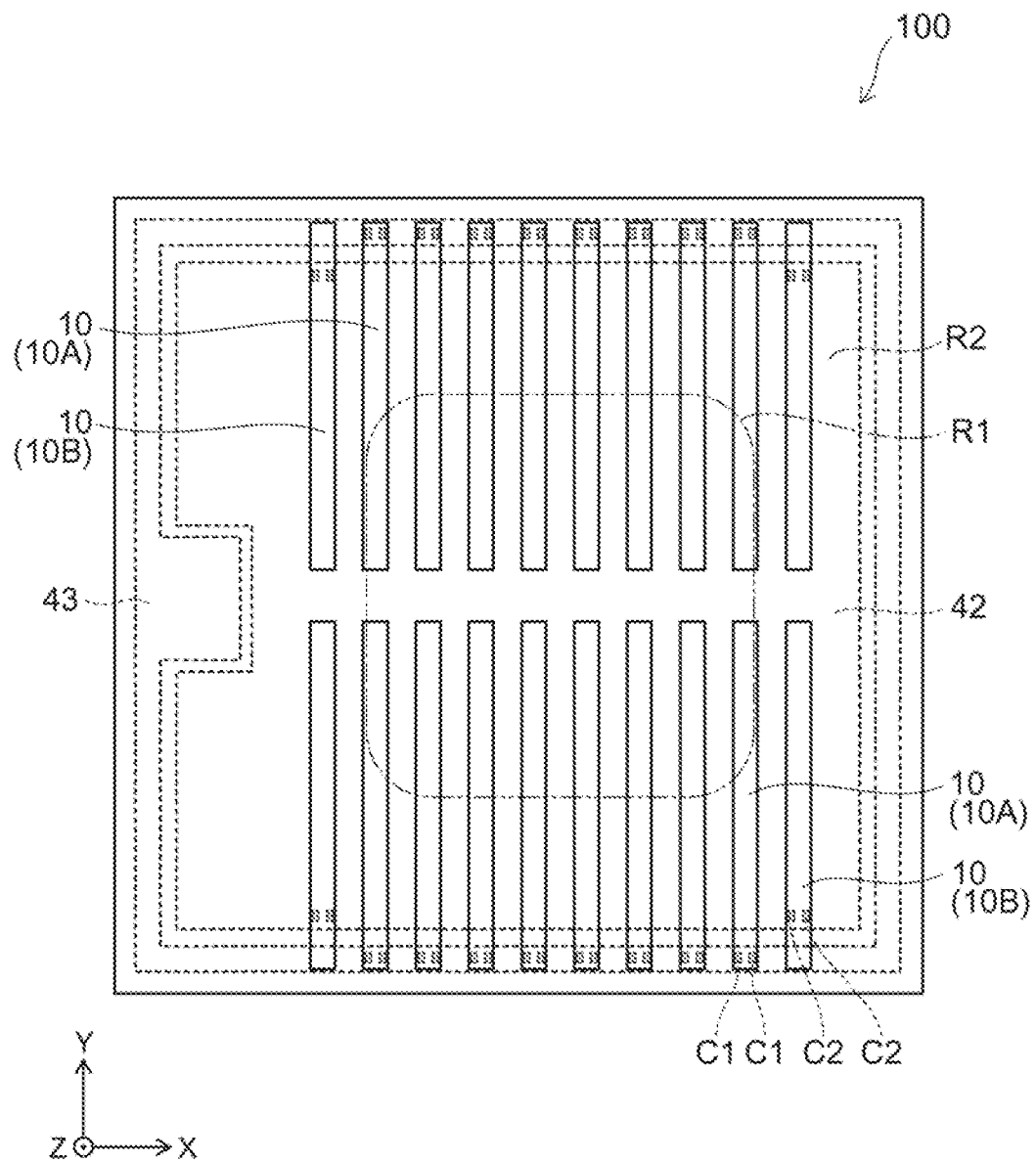
FIG. 2 is a plan view of the semiconductor device according to the first embodiment.
Figure 3:
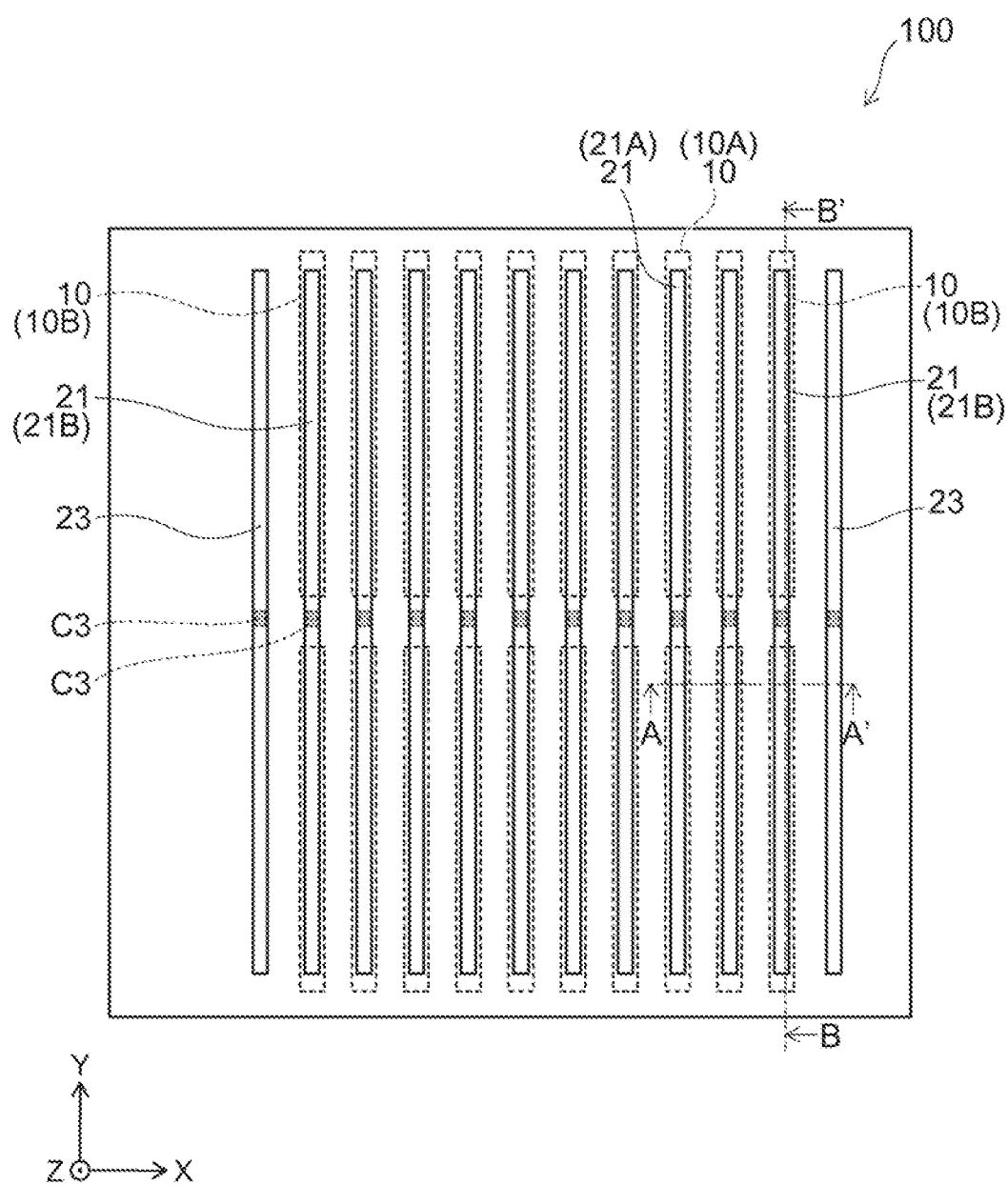
FIG. 3 is a plan view of the semiconductor device according to the first embodiment.

FIG. 1 to FIG. 3 are plan views of the semiconductor device 100 according to the first embodiment.

Figure 4:
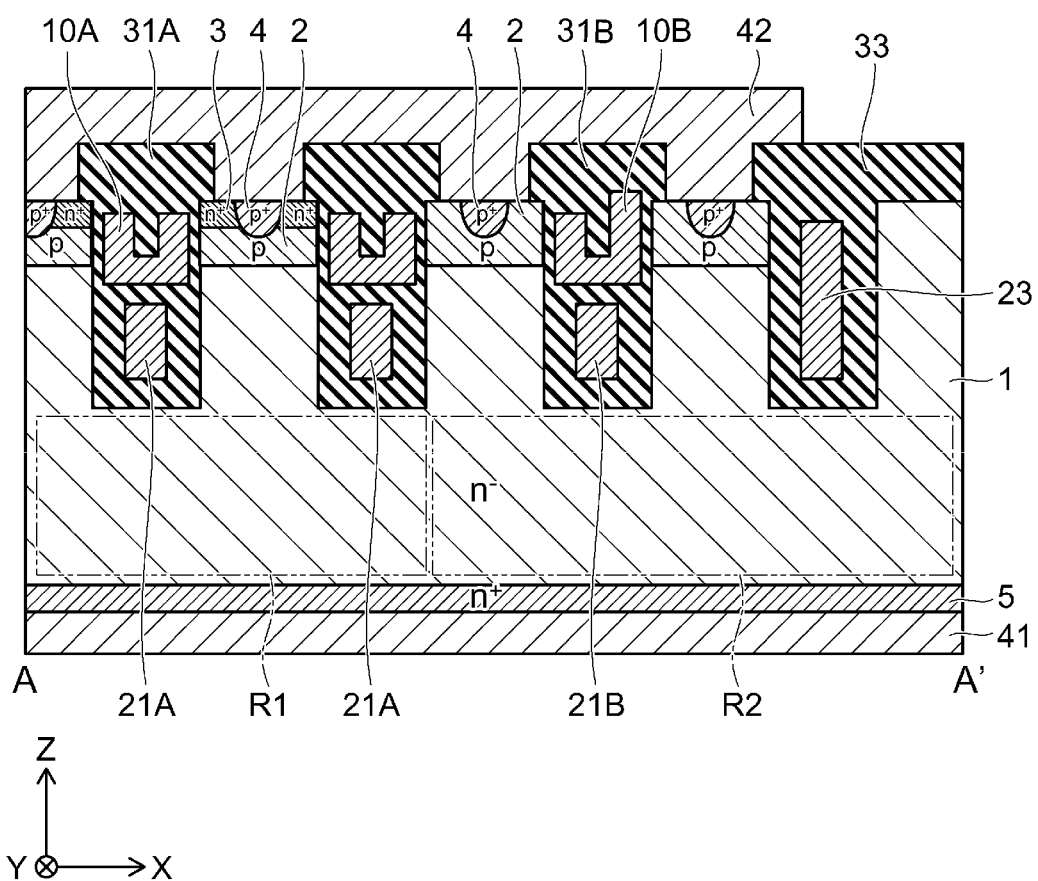
FIG. 4 is a cross-sectional view taken along line A-A' of FIG. 3.

FIG. 4 is a cross-sectional view taken along line A-A' of FIG. 3.

Figure 5:
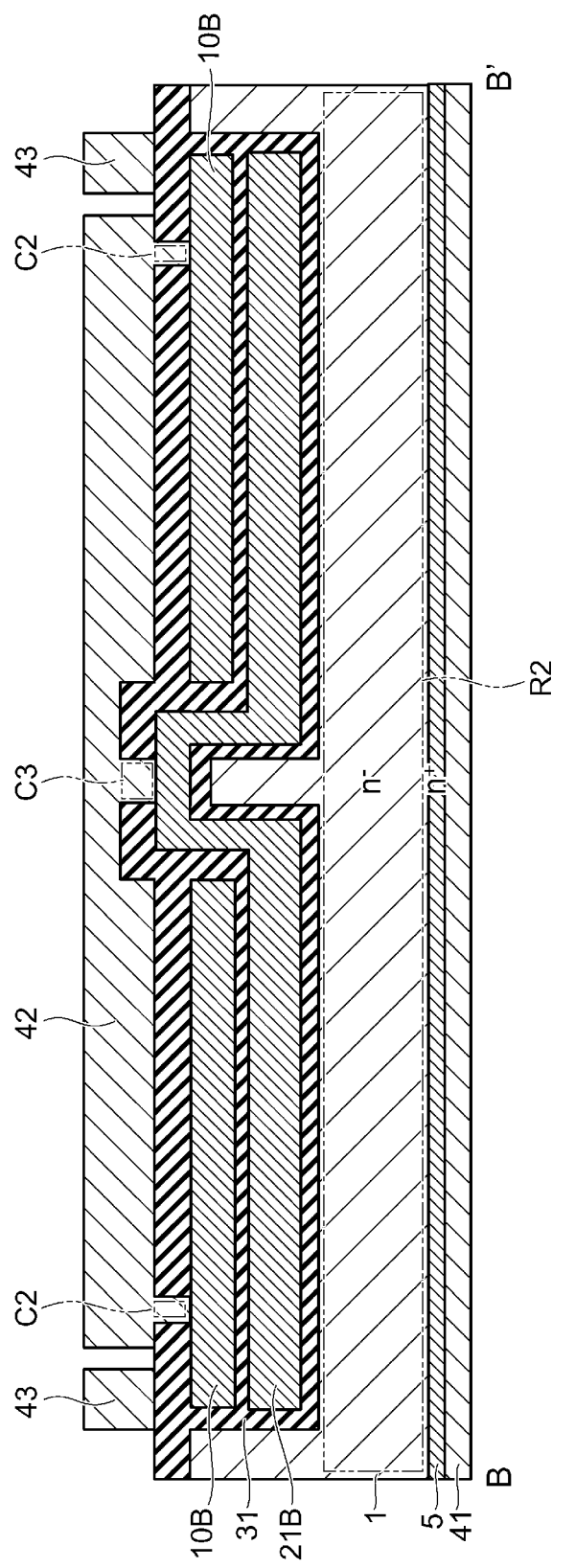
FIG. 5 is a cross-sectional view taken along line B-B' of FIG. 3.

FIG. 5 is a cross-sectional view taken along line B-B' of FIG. 3.

Figure 6:
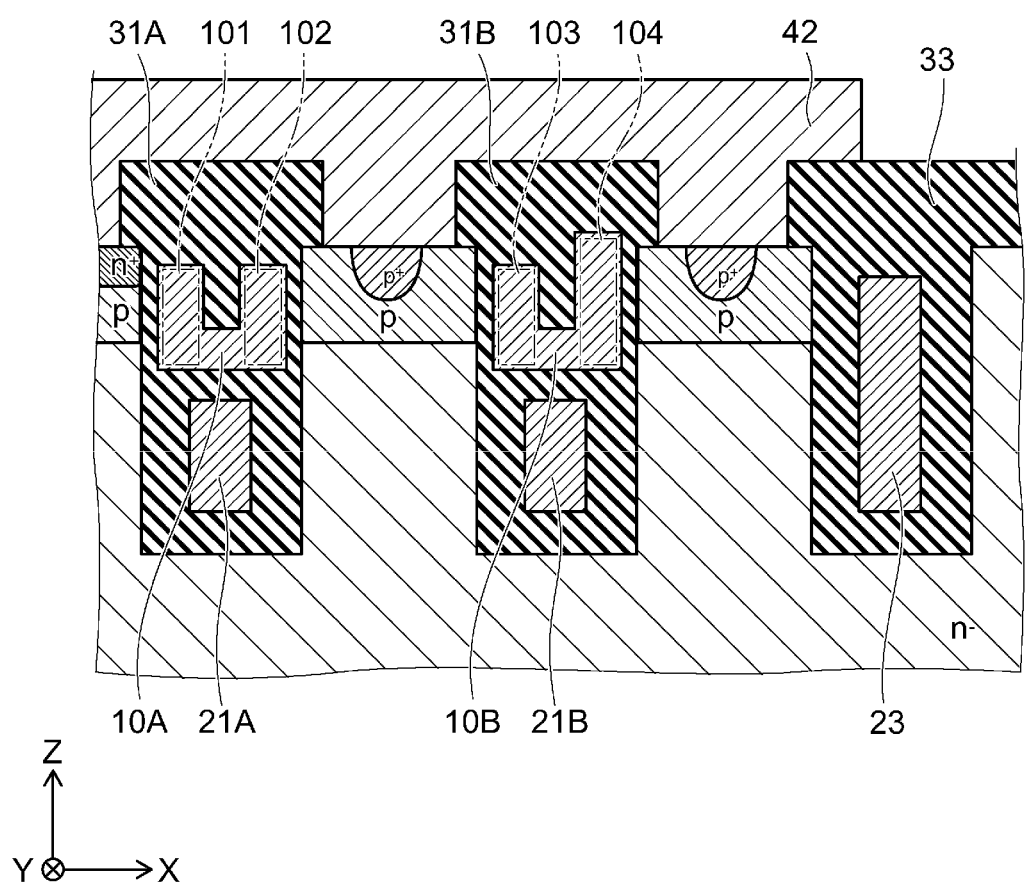
FIG. 6 is a cross-sectional view in which a part of FIG. 4 is enlarged.

FIG. 6 is a cross-sectional view in which a part of FIG. 4 is enlarged.

In FIG. 2, a source electrode 42 and a gate pad 43 are illustrated as dashed line outlines, and a portion of the configuration elements are omitted. In FIG. 3, electrodes 10 are illustrated as dashed line outlines, and a portion of the configuration elements are omitted.

In addition, in FIG. 2, the first region R1 and the second region R2 included in an n$^-$-type semiconductor region 1 are illustrated as dashed line outlines.

The semiconductor device 100 is, for example, a MOS-FET.

As illustrated in FIG. 1 to FIG. 6, the semiconductor device 100 includes an n$^+$-type (first conductive type) drain region 5, an n$^-$-type semiconductor region 1 (first semiconductor region), a p-type (a second conductive type) base region 2 (a second semiconductor region), an n$^+$-type source region 3 (a third semiconductor region), a p$^+$-type contact region 4, the electrode 10, a field plate electrode (hereafter, referred to as FP electrode) 21, an FP electrode 23 (a fifth electrode), an insulating portion 31, an insulating portion 33 (a third insulating portion), a drain electrode 41, a source electrode 42 (a fourth electrode), and the gate pad 43.

As illustrated in FIG. 1, the source electrode 42 and the gate pad 43 are provided on an upper surface of the semiconductor device 100 spaced apart from each other.

As illustrated in FIG. 2, the electrodes 10 are provided beneath the source electrode 42 and the gate pad 43. A plurality of electrodes 10 are provided in the X direction, and respectively extend in the Y direction.

Some of the plurality of electrodes 10 are gate electrodes 10A electrically connected to the gate pad 43 via a connection portion C1, and the other portions are electrodes 10B (a third electrode) electrically connected to the source electrode 42 via a connection portion C2. The gate electrodes 10A are provided between the electrodes 10B in the X direction.

Hereinafter, properties common to the gate electrode 10A and the electrodes 10B will be collectively described as the "electrodes 10".

As illustrated in FIG. 2, the n$^-$-type semiconductor region 1 includes the first region R1 and the second region R2 provided around the first region R1. Some of gate electrodes 10A are provided on the first region R1, and the other portions are provided on the second region R2. In addition, the electrode 10B is provided on the second region R2.

As illustrated in FIG. 3, an FP electrode 21 is provided beneath each of the electrodes 10. Each FP electrode 21 extends in the Y direction. In addition, the FP electrodes 21 are provided between the FP electrodes 23 in the X direction. The FP electrodes 21 and 23 are electrically connected to the source electrode 42 via a connection portion C3.

Some of the plurality of FP electrodes 21 are the FP electrodes 21A (first electrodes) provided corresponding to the gate electrode 10A, and the other portions are the FP electrodes 21B (second electrodes) provided corresponding to the electrode 10B.

Similar to the electrode 10, hereinafter, properties common to the FP electrode 21A and 21B will be collectively described as the "FP electrodes 21".

As illustrated in FIG. 4 and FIG. 5, the drain electrode 41 is provided on the bottom surface of the semiconductor device 100.

The n$^+$-type drain region 5 is provided on the drain electrode 41 and electrically connected to the drain electrode 41.

The n$^-$-type semiconductor region 1 is provided on the n$^+$-type drain region 5.

As illustrated in FIG. 4, a plurality of p-type base regions 2 is provided on the n$^-$-type semiconductor region 1 and spaced apart in the X direction. Some of the plural p-type base regions 2 are provided on the first region R1 and the other portions of the p-type base regions 2 are provided on the second region R2.

The n$^+$-type source region 3 is provided on each of the p-type base region 2 on the first region R1.

The p$^+$-type contact region 4 is provided on each of the p$^+$-type base region 2 on the first region R1 and the second region R2.

A plurality of insulating portions 31 are provided on the n$^-$-type semiconductor region 1 and spaced from one another in the X direction.

In addition, some of the plurality of insulating portion 31 are the insulating portions 31A (first insulating portions) provided corresponding to the gate electrode 10A and the others are the insulating portion 31B (second insulating portions) provided corresponding to the electrode 10B.

Hereinafter, properties common to the insulating portions 31A and 31B will be collectively described as the "insulating portion 31".

Each FP electrode 21 is surrounded by a corresponding respective insulating portion 31, and the field plate electrodes extend in the Z direction and are regularly spaced in the X direction within the n$^-$-type semiconductor region 1. Each electrode 10 is surrounded by a corresponding respective insulating portion 31 and is positioned over, and spaced from, each respective FP electrode 21 within the same individual insulating portion 31. The electrodes 10 are spaced apart in the X direction with individual ones of the p-type base regions 2 interposed therebetween.

In addition, the thickness of the insulating portion 31 between the FP electrode 21 and the adjacent portions of the n$^-$-type semiconductor region 1 in the X direction is greater than the thickness of the insulating portion 31 between the electrode 10 and the adjacent p-type base regions 2 in the X direction.

The insulating portion 33 is provided on the second region R2. The insulating portion 31B is provided between the insulating portions 31A and 33 in the X direction.

The FP electrode 23 in the second region R2 is surrounded by the insulating portion 33 and extends inwardly of the n$^-$-type semiconductor region 1 such that the n$^-$-type semiconductor region 1 extends along either side thereof in the X direction. The length of the FP electrode 23 in the Z direction is greater than the length of the FP electrode 21 in the Z direction.

The source electrode 42 is provided on the p-type base region 2, the n$^+$-type source region 3, and the p$^+$-type contact region 4, and is electrically connected to those semiconductor regions. In addition, as described above, the electrode 10B, the FP electrode 21, and the FP electrode 23 are electrically connected to the source electrode 42.

The individual insulating portions 31A are provided between the source electrode 42 and the gate electrode 10A, and those electrodes are electrically separated.

As illustrated in FIG. 6, the electrodes 10 have a generally U-shape in an X-Z plane cross section. Specifically, the gate electrode 10A includes a first portion 101 and a second portion 102. The first portion 101 and the second portion 102 are spaced apart in the X direction and extend along the Z direction, and a base, extending in the X direction and immediately over and spaced from the adjacent field plate electrode 21A by a portion of insulating layer 31A, connects the first portion 101 and the second portion 102 together.

Similarly, the electrode 10B includes a third portion 103 and a fourth portion 104. The third portion 103 and the fourth portion 104 are partially separated in the X direction and extend along the Z direction and a base, extending in the X direction and immediately over and spaced from the adjacent field plate electrode 21B by a portion of insulating layer 31B, connects the third portion 103 and the fourth portion 104 together. The third portion 103 is provided between the gate electrode 10A and the fourth portion 104 in the X direction.

The upper end of the fourth portion 104 is positioned above the upper end of the third portion 103. The length of the fourth portion 104 in the Z direction is greater than the length of the third portion 103 in the Z direction, such that the fourth portion 104 extends closer to the source electrode 42 than does the third portion 103. Additionally, the lengths of the first portion 101, the second portion 102, and the third portion 103 in the Z direction are substantially the same. Therefore, the length of the electrode 10B in the Z direction is greater than the length of the gate electrode 10A in the Z direction.

Next, an operation of the semiconductor device 100 will be described.

In a state in which a positive voltage with respect to the source electrode 42 is applied to the drain electrode 41, when a voltage equal to or higher than a threshold value is applied to the gate electrode 10A, the semiconductor device is in ON state. At this time, a channel (an inversion layer) is formed in the p-type base region 2 in the vicinity of the insulating portion 31A.

Then, when the voltage applied to the gate electrode 10A becomes lower than the threshold value, the semiconductor device enters OFF state.

When the semiconductor device is in OFF state and a positive potential with respect to a potential of the source electrode 42 is applied to the drain electrode 41, a depletion layer spreads toward the n$^-$-type semiconductor region 1 from an interface between the insulating portion 31 and the n$^-$-type semiconductor region 1 due to a potential difference between the FP electrode 21 and the drain electrode 41. In this way, it is possible to increase the breakdown voltage of the semiconductor device. Alternatively, n-type impurity concentration in the n$^-$-type semiconductor region 1 can be increased as much as the increased amount of breakdown voltage of the semiconductor device.

Here, an example of materials of each configuration elements will be described.

The n$^+$-type drain region 5, the n$^-$-type semiconductor region 1, the p-type base region 2, the n$^+$-type source region 3, and the p$^+$-type contact region 4 contain silicon, silicon carbide, gallium nitride, or gallium arsenide as semiconductor materials. When silicon is used as the semiconductor material, arsenic, phosphorus, or antimony can be used as the n-type impurity. Boron can be used as the p-type impurity.

The electrode 10 and the FP electrode 21 contain a conductive material such as polysilicon.

The insulating portions 31 and 33 contain an insulation material such as silicon oxide or silicon nitride.

The drain electrode 41, the source electrode 42, and the gate pad 43 contain a metal such as aluminum.

Next, an example of a method of manufacturing the semiconductor device 100 will be described with reference to FIGS. 7A to 9B.

FIGS. 7A to 9B are cross-sectional views illustrating the result of steps in the process of manufacturing the semiconductor device 100 according to the first embodiment.

FIGS. 7A to 9B illustrate the cross-sections of the process at the position of the line A-A' in FIG. 3.

Figure 7A:
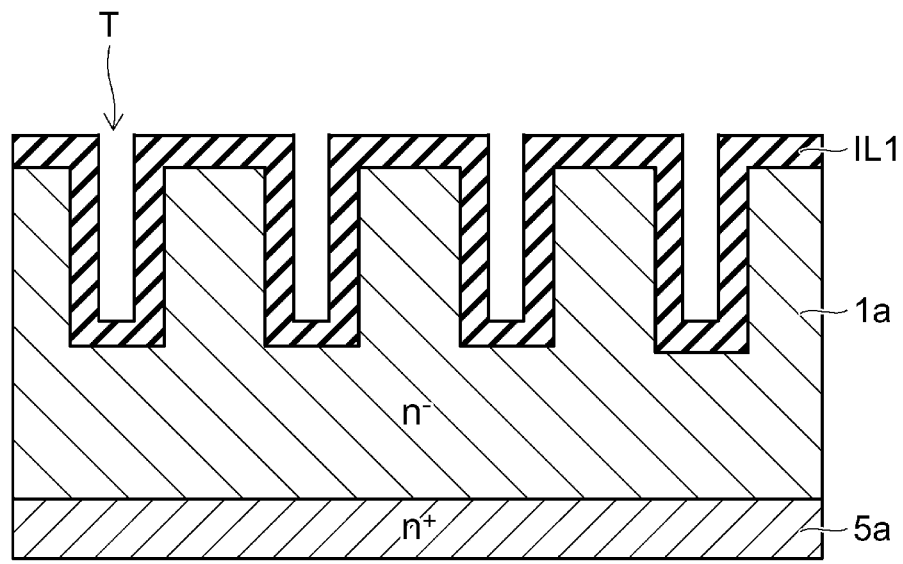
FIGS. 7A and 7B are cross-sectional views illustrating the result of process steps of manufacturing the semiconductor device according to the first embodiment.

First, a semiconductor substrate on which an n$^-$-type semiconductor layer 1a is provided on an n$^+$-type semiconductor layer 5a is prepared. Next, a plurality of trenches T is formed inwardly of a front surface of the n$^-$-type semiconductor layer 1a. Subsequently, as illustrated in FIG. 7A, an insulating layer IL1 is formed along inner walls of the trenches T and the upper surface of the n$^-$-type semiconductor layer 1a.

Figure 7B:
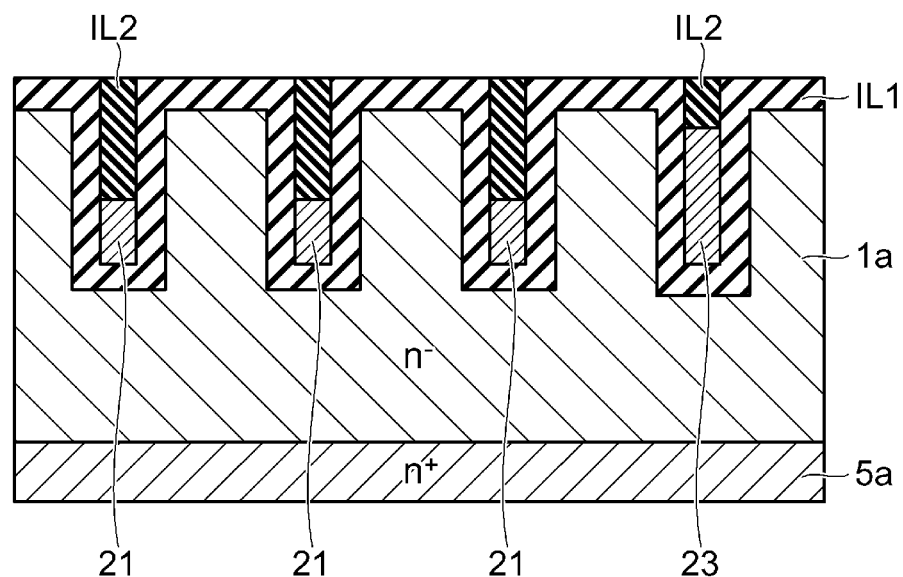

Next, the FP electrodes 21 and 23 are formed inside the trenches T by forming a conductive layer on the insulating layer IL1 and etching back the conductive layer. Subsequently, insulating layers IL2 to cover the trenches T and FP electrodes are formed on the FP electrodes 21 and 23. The insulating layer IL2 contains an insulation material different from that contained in the insulating layer IL1 such that the etching of the insulating layer IL1 can be selectively performed with respect to the insulating layer IL2. Subsequently, a portion of the insulating layer IL2 is selectively removed with respect to the insulating layer IL1. From this process, the insulating layers IL2 that cover the upper surfaces of each FP electrodes in each of the trenches T are formed as illustrated in FIG. 7B.

Figure 8A:
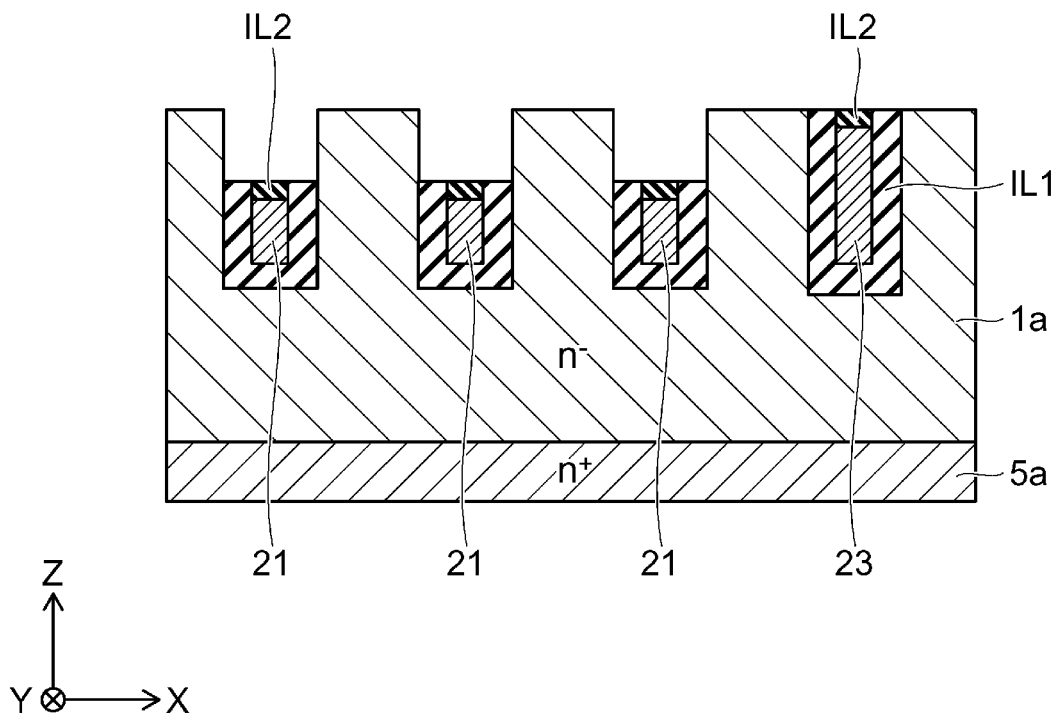
FIGS. 8A and 8B are cross-sectional views illustrating the result of process steps of manufacturing the semiconductor device according to the first embodiment.

Next, a portion of the insulating layer IL1 is selectively removed with respect to the insulating layers IL2. Likewise, a portion of the insulating layer IL2 over the field plate electrodes 21 is removed. At this point, the insulating layer IL1 is removed such that the position of the upper end of the insulating layer IL1 becomes substantially same as the position of the upper end of the insulating layer IL2 in each of the trenches T. In this way, as illustrated in FIG. 8A, a portion of the front surface and the side surface of the n$^-$-type semiconductor layer 1a facing the trenches is exposed.

Figure 8B:
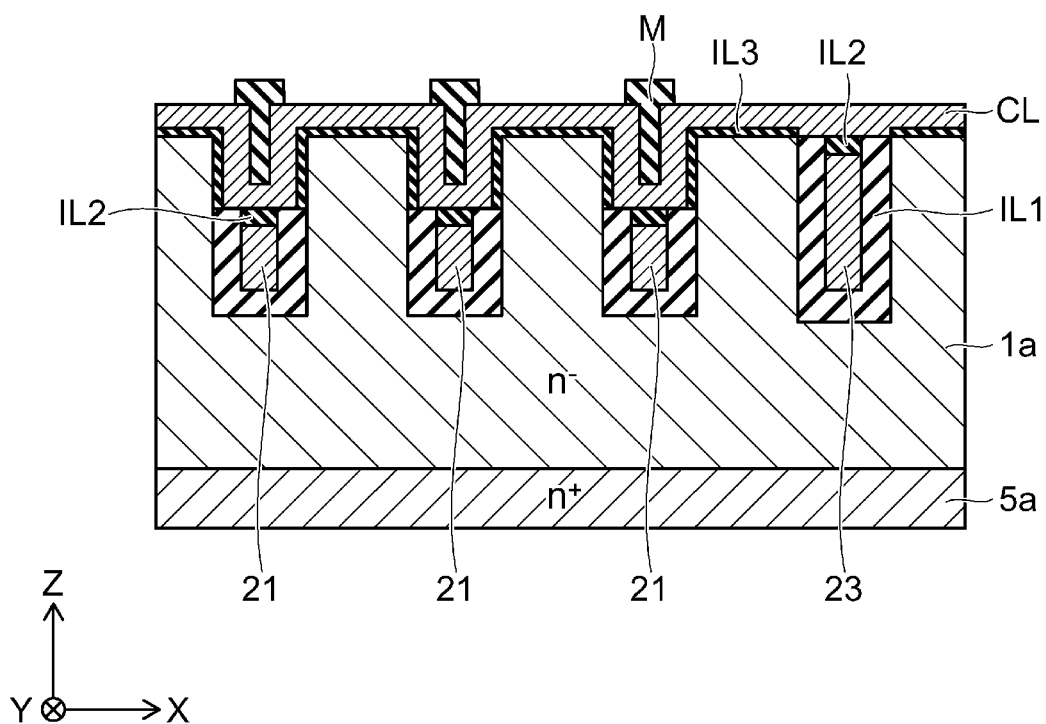

Next, an insulating layer IL3 is formed over the front and side surfaces of the exposed n$^-$-type semiconductor layer 1a. Subsequently, a conductive layer CL is conformally formed over the insulating layer IL3 and the upper surfaces of insulating layers ILB1 and ILB2 in the trenches corresponding to field plate electrodes 21. As a result of the conformal deposition of the conductive layer CL, recesses are formed on the front surface of the conductive layer CL over each FP electrode 21. Subsequently, masks M are formed in the recesses and over immediately adjacent portions of the front surface of the conductive layer CL. As illustrated in FIG. 8B, the masks M are formed spaced from one another and they fill each of the cavities on the front surface of the conductive layer CL. The masks M are made from, for example, photoresist.

Next, a portion of the conductive layer CL is etched using the mask M to form a pattern in the conductive layer CL.

Figure 9A:
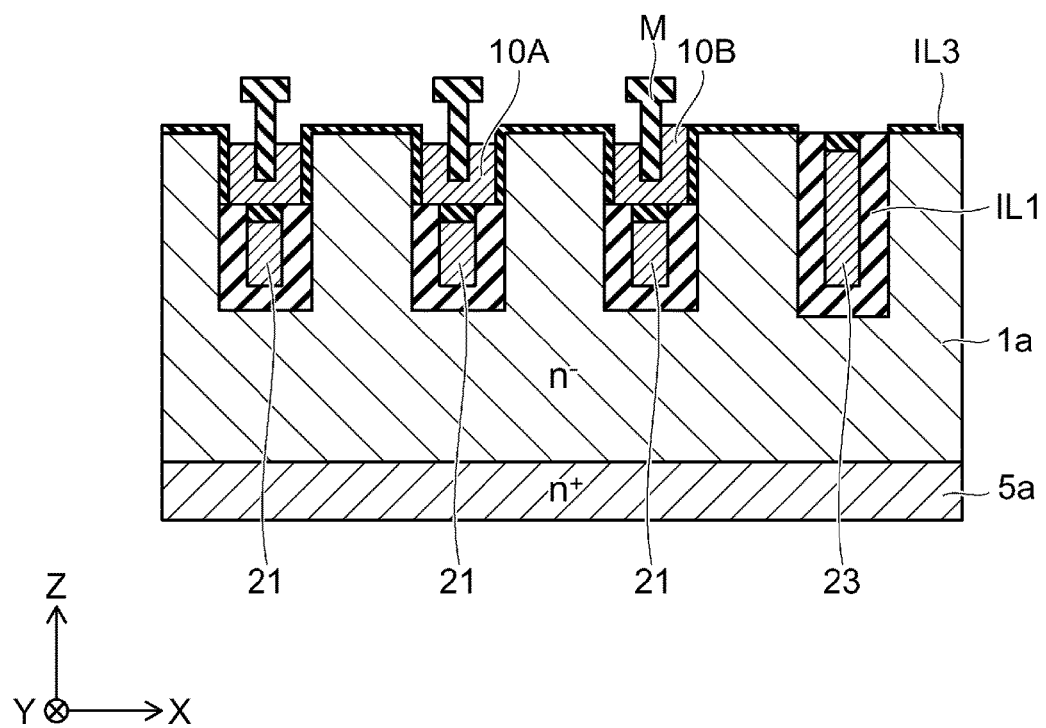
FIGS. 9A and 9B are cross-sectional views illustrating the result of process steps of manufacturing the semiconductor device according to the first embodiment.

Isotropic etching such as a chemical dry etching (CDE) method is used for etching the conductive layer CL. As a result, as illustrated in FIG. 9A, a portion of the conductive layer CL positioned below the masks M is removed by etching. Through this process, the electrode 10 is formed.

As illustrated in FIG. 8B, in the region where a plurality of FP electrodes 21 are provided, a plurality of individual masks M is provided on the conductive layer CL. On the other hand, in the region outside of the region described above, the mask M is not provided on the conductive layer CL. In this state, when the conductive layer CL is etched by the CDE method using the masks M, since the active species of the reactive gas is largely consumed in the outside region, an etching rate with respect to the conductive layer CL in the outside region decreases. In this way, among the plurality of electrodes 10 aligned in the X direction, the location of the upper end of the electrodes 10 located at the opposed ends of the plurality of electrodes 10 spaced in the X direction is closer to the upper surface of the n⁻-type semiconductor region 1 than the upper ends of the other electrodes 10, i.e., they are higher than the position of the upper end of other electrodes 10. As a result thereof, as illustrated in FIG. 6, the higher or taller fourth portion 104 of electrode 10B is formed.

Figure 9B:
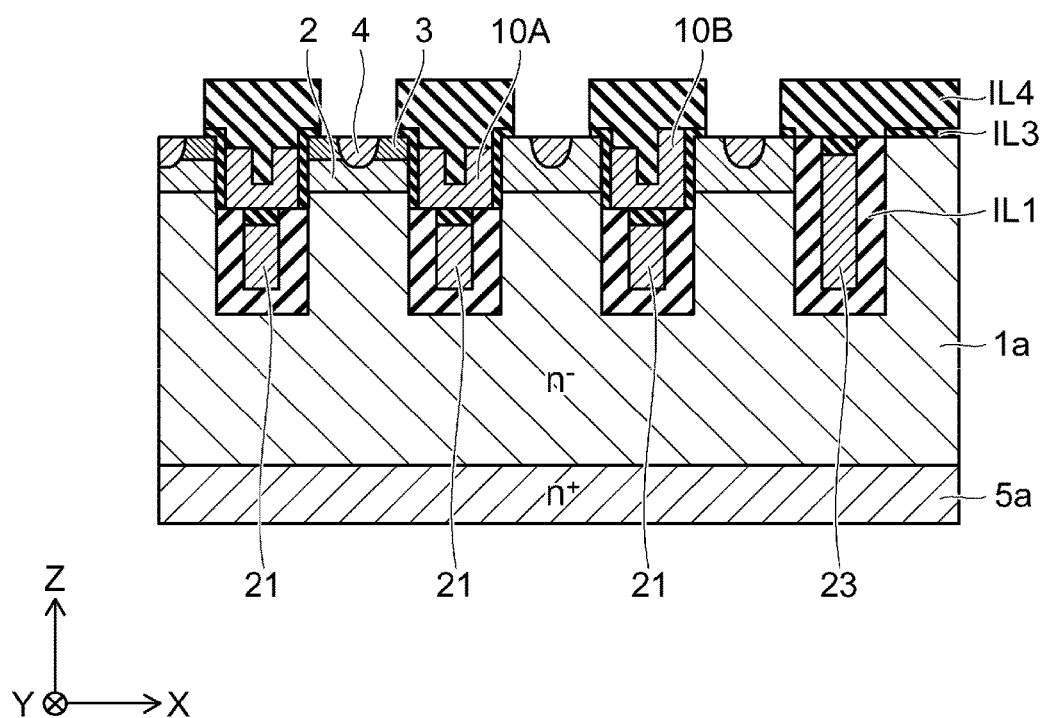

After forming the electrodes 10, the masks M are removed, and ions of the n-type impurity and p-type impurity are sequentially implanted into predetermined regions on the front surface of the n⁻-type semiconductor layer 1a. In this way, the p-type base region 2, the n⁺-type source region 3, and the p⁺-type contact region 4 are formed. Subsequently, the gate electrode 10A, the electrode 10B, and an insulating layer IL4 that covers these semiconductor regions are formed. Subsequently, as illustrated in FIG. 9B, portions of the insulating layer IL4 are removed, and thus the p-type base region 2, the n⁺-type source region 3, and the p⁺-type contact region 4 are exposed between adjacent insulating portions 31A in the X direction.

Next, the source electrode 42 and the gate pad 43 are formed by forming a metal layer that covers the insulating layer IL4 on the n⁻-type semiconductor layer 1a and by patterning the metal layer. Subsequently, a rear surface of the n⁺-type semiconductor layer 5a is ground until the thickness of the n⁺-type semiconductor layer 5a becomes a predetermined value. Then, the semiconductor device 100 illustrated in FIG. 1 to FIG. 6 can be obtained by forming the metal layer on the rear surface of the n⁺-type semiconductor layer 5a and forming the drain electrode 41.

In the method of manufacturing the semiconductor device described above, for example, a chemical vapor deposition (CVD) method is used for forming the insulating layers IL1, IL2, and IL4, and the conductive layer CL.

The insulating layer IL3 is formed by, for example, thermally oxidizing the front surface of the n⁻-type semiconductor layer 1a.

Here, actions and effects by the present embodiment will be described.

It is desirable that the thickness of the insulating portion 31 between the FP electrode 21 and the n⁻-type semiconductor region 1 is thick in order to improve the breakdown voltage of the semiconductor device and to decrease the capacitance between the source and the drain. In order to increase the thickness of the insulating portion 31 between the FP electrode 21 and the n⁻-type semiconductor region 1, it is necessary to form the width of the trench T be wide and form the insulating layer IL1 in the trench T thickly in the process illustrated in FIG. 7A.

However, when the width of the trench T becomes wide, the time required for filling the opening in the insulating layer IL3 lining the trench T with the conductive layer CL becomes long in the process illustrated in next FIG. 8B, and thus, productivity decreases.

Therefore, in the present embodiment, an electrode 10 having U-shape in section is formed by forming the conductive layer CL along the inner wall of the trench T and then, performing isotropic etching using the mask M.

On the other hand, when the U-shaped electrode 10 is formed, as described above, there is a case where the electrode 10B including the fourth portion 104 as illustrated in FIG. 6 is formed due to variations in the density of the reactant on the conductive layer CL.

Since the upper end of the fourth portion 104 is positioned higher than the upper end of the gate electrode 10A, a distance between the fourth portion 104 and the source electrode 42 is shorter than a distance between the gate electrode 10A and the source electrode 42. Therefore, when the electrode 10B is connected to the gate pad 43 similarly to the gate electrode 10A, if the gate voltage is applied, the voltage gradient across the insulating portion 31B between the electrode 10B and the source electrode 42 is greater than the voltage gradient across the insulating portion 31A between the gate electrode 10A and the source electrode 42. As a result thereof, dielectric breakdown in the insulating portion 31B may occur or a leakage current from the electrode 10B to the source electrode 42 may occur. In addition, in a portion of the insulating portion 31, a portion covering the electrode 10 is an insulating film formed typically by the CVD method. Therefore, if the high voltage is repeatedly applied, a time dependent dielectric breakdown (TDDB) may occur.

On the contrary, in the present embodiment, the electrode 10B is connected to the source electrode 42. Therefore, even when the gate voltage is applied, no potential difference is generated between the electrode 10B and the source electrode 42. Therefore, the possibility of occurrence of the dielectric breakdown in the insulating portion 31B or occurrence of the leakage current as a result of the voltage difference is eliminated, and thus, it is possible to improve the reliability of the semiconductor device.

First Modification Example

Figure 10:
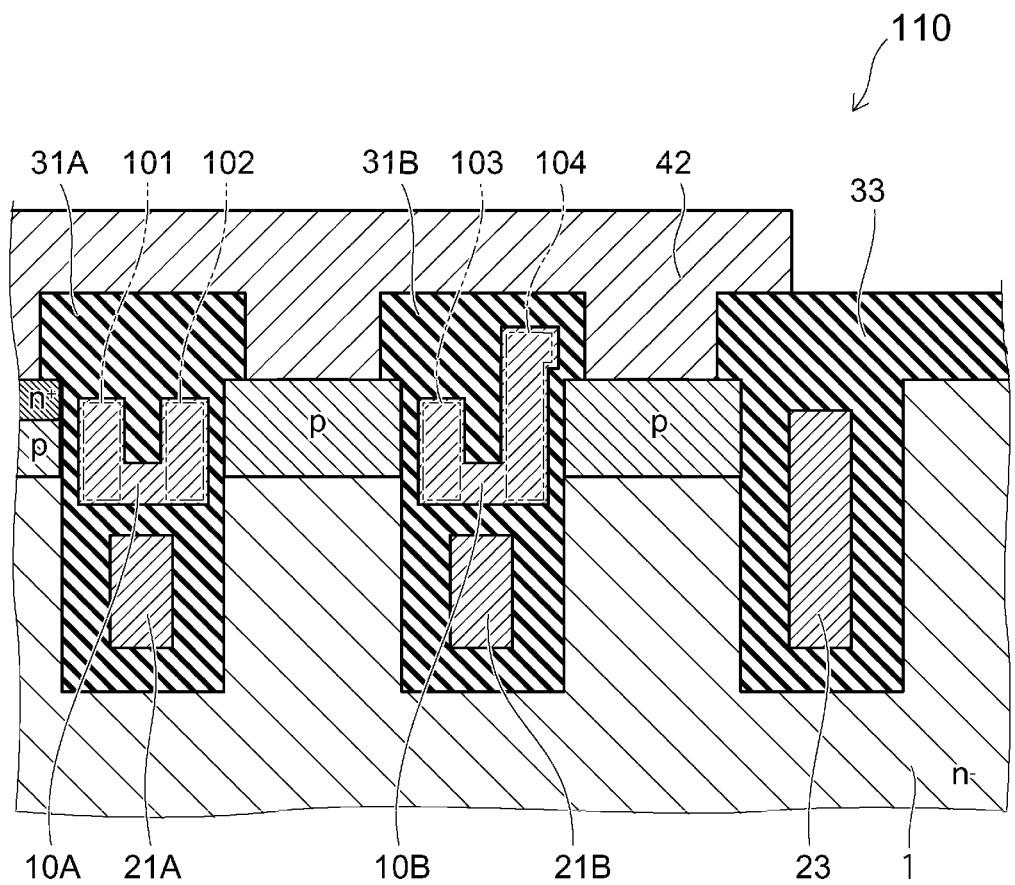
FIG. 10 is a cross-sectional view in which a portion of a semiconductor device according to a first modification example of the first embodiment is enlarged.

FIG. 10 is a cross-sectional view in which a portion of a semiconductor device 110 in a first modification example of the first embodiment is enlarged.

The semiconductor device 110 is different from the semiconductor device 100 in a shape of the fourth portion 104. Specifically, in the semiconductor device 110, the upper end of the fourth portion 104 is bent toward the outer edge (X direction) of the semiconductor device.

In the process of forming the electrode 10 illustrated in FIGS. 8B and 9A, if the etching rate with respect to the outside conductive layer CL is low, as illustrated in FIG. 10, there is a case where the electrode 10B is formed in which the upper end portion of the fourth portion 104 extends in the X direction toward the circumferential edge of the device.

If the electrode 10B is connected to the gate pad 43, when the gate voltage is applied, an electric field concentration occurs at the bent portion, and the dielectric breakdown easily occurs in the insulating portion 31B.

However, according to the present embodiment, since the electrode 10B is connected to the source electrode 42, even if the upper end portion of the fourth portion 104 is bent, the electric field concentration does not occur when the gate voltage is applied. Therefore, the present embodiment is particularly effective in the semiconductor device having the electrode 10B of which the upper end portion of the fourth portion 104 is bent as illustrated in FIG. 10.

Second Modification Example

Figure 11:
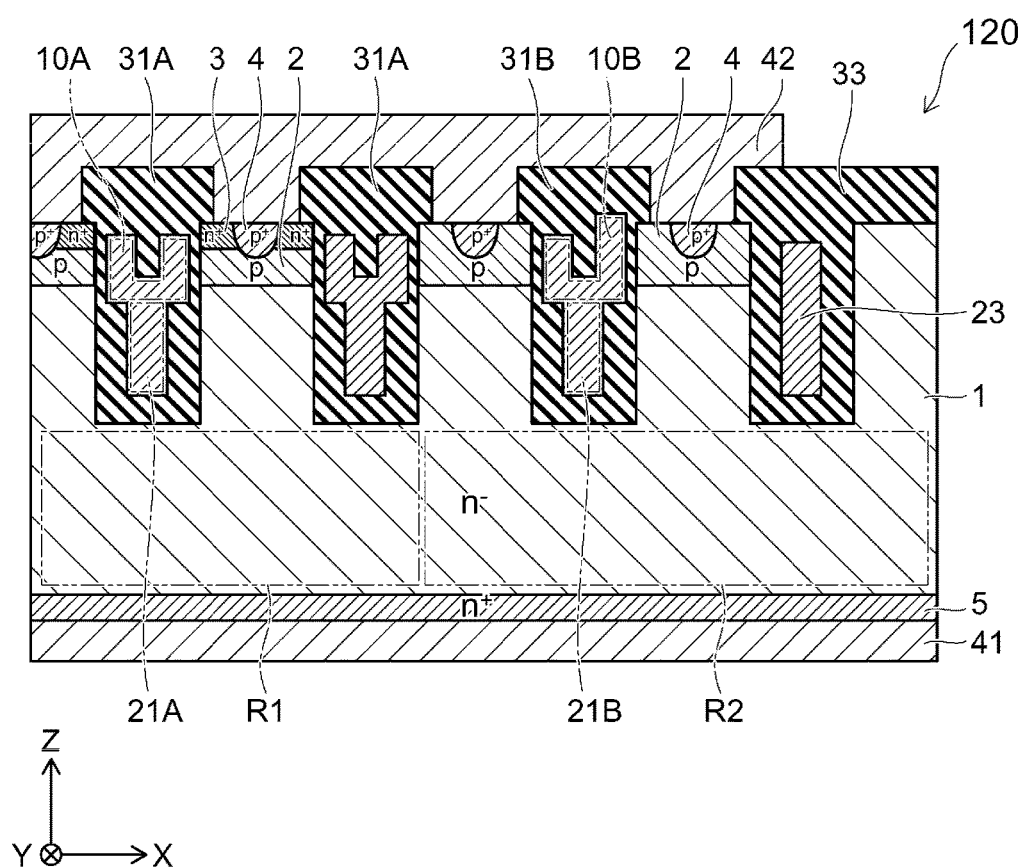
FIG. 11 is a cross-sectional view in which a portion of a semiconductor device according to a second modification example of the first embodiment is enlarged.

FIG. 11 is a cross-sectional view in which a portion of a semiconductor device 120 according to a second modification example of the first embodiment is enlarged.

In the semiconductor device 120, the gate electrode 10A and the FP electrode 21A are provided integrally and the electrode 10B and the FP electrode 21B are provided integrally, differently than in the semiconductor device 100. Therefore, the FP electrode 21A is electrically connected to the gate pad 43 while the electrode 10B and the FP electrode 21B are electrically connected to the source electrode 42.

Even in a case of this structure, when the semiconductor device is in OFF state, the depletion layer expands toward the n⁻-type semiconductor region 1 due to the potential difference between the FP electrode 21 and the drain electrode 41, similarly to the semiconductor device 100. For this reason, it is possible to increase the breakdown voltage of the semiconductor device.

In addition, even in this modification example, since the electrode 10B is electrically connected to the source electrode 42, the possibility of occurrence of the dielectric breakdown in the insulating portion 31B or occurrence of the leakage current because of a voltage gradient between the source electrode 42 and the electrode 10B is eliminated and thus, it is possible to improve the reliability of the semiconductor device, similarly to the semiconductor device 100.

Third Modification Example

Figure 12:
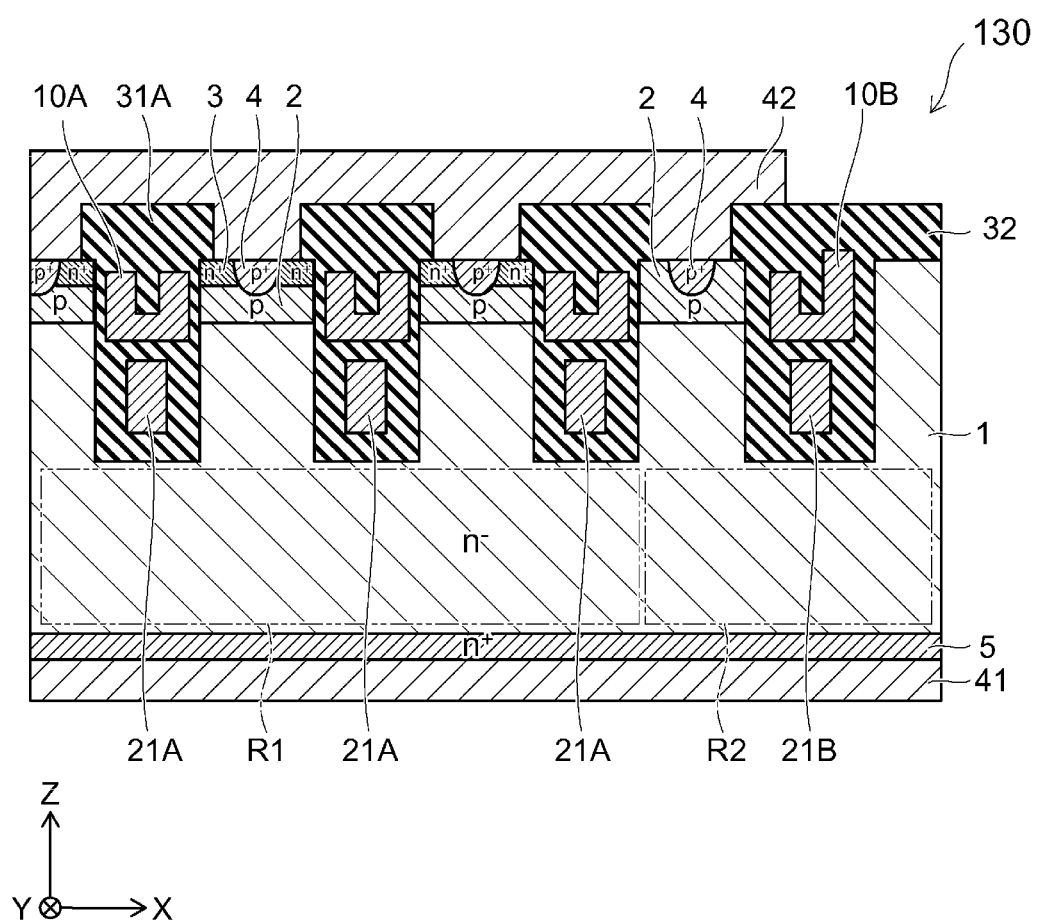
FIG. 12 is a cross-sectional view in which a portion of a semiconductor device according to a third modification example of the first embodiment is enlarged.

FIG. 12 is a cross-sectional view in which a portion of a semiconductor device 130 according to a third modification example of the first embodiment is enlarged.

The semiconductor device 130 is different from the semiconductor device 100 in that the FP electrode 23 is not provided. Therefore, the FP electrode 21B is positioned at the end in the X direction among the plurality of FP electrodes provided on the semiconductor device 130.

In addition, in the semiconductor device 130, the thickness of the insulating portion 31B between the electrode 10B and the n-type semiconductor region 1 in the X direction is greater than the thickness of the insulating portion 31 between the gate electrode 10A and the p-type base region 2 in the X direction. This is because, in the semiconductor device 130, the p-type base region 2 is not provided on one side of the electrode 10B and the electric field strength in the insulating portion 31B is higher than that in the semiconductor device 100. It is possible to suppress the dielectric breakdown in the insulating portion 31B by increasing the thickness of the insulating portion 31B.

In this modification example also, since the electrode 10B is electrically connected to the source electrode 42, it is possible to improve the reliability of the semiconductor device, similarly to the semiconductor device 100.

Fourth Modification Example

Figure 13:
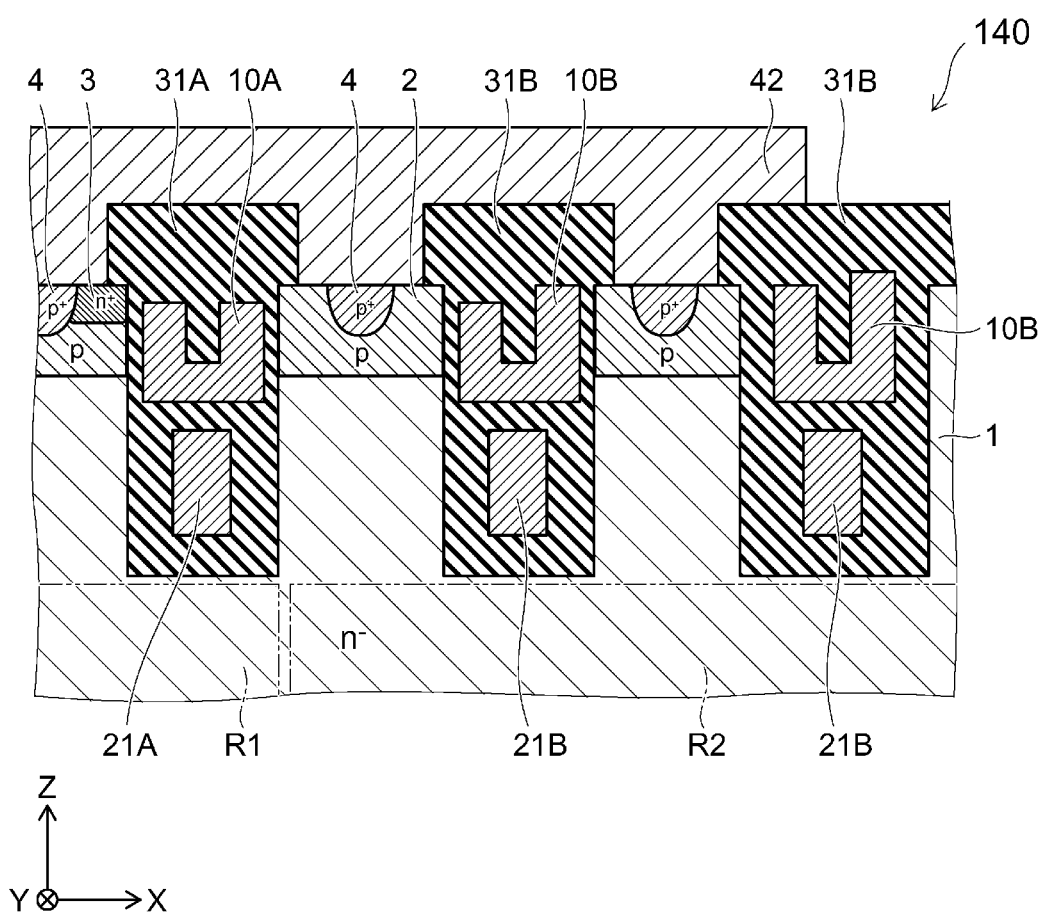
FIG. 13 is a cross-sectional view in which a portion of a semiconductor device according to a fourth modification example of the first embodiment is enlarged.

FIG. 13 is a cross-sectional view in which a portion of a semiconductor device 140 according to a fourth modification example of the first embodiment is enlarged.

The semiconductor device 140 is different from the semiconductor device 130 in a point that the plurality of electrodes 10B is provided in second region R2. That is, in the semiconductor device 140, the plurality of electrodes 10 adjacent to each other provided on the second region R2 are connected to the source electrode 42.

Each of the upper ends of the plurality of electrodes 10B is positioned higher than the position of the upper end of the gate electrode 10A. In addition, the position of the upper end of the electrode 10B becomes higher as the upper end of the gate electrode 10A is closer to the outer circumference of the semiconductor substrate or the chip on which the device is formed.

In the process of forming the electrodes 10 illustrated in FIGS. 8B and 9A, in some cases, the position of the upper end of the plurality of electrodes 10 positioned at the outside is higher than the position of the upper end of other electrodes 10 positioned at the inside. In such a case, by connecting only the electrode 10 positioned at the outermost circumference to the source electrode 42 as in the case of the semiconductor device 100, it is not possible to sufficiently improve the reliability of the semiconductor device.

According to the present modification example, since a plurality of electrodes 10B connected to the source electrode 42 is provided, the possibility of occurrence of the dielectric breakdown in the insulating portion 31B or the occurrence of the leakage current decreases, and thus, it is possible to improve the reliability of the semiconductor device, similarly to the semiconductor device 100.

Second Embodiment

Figure 14:
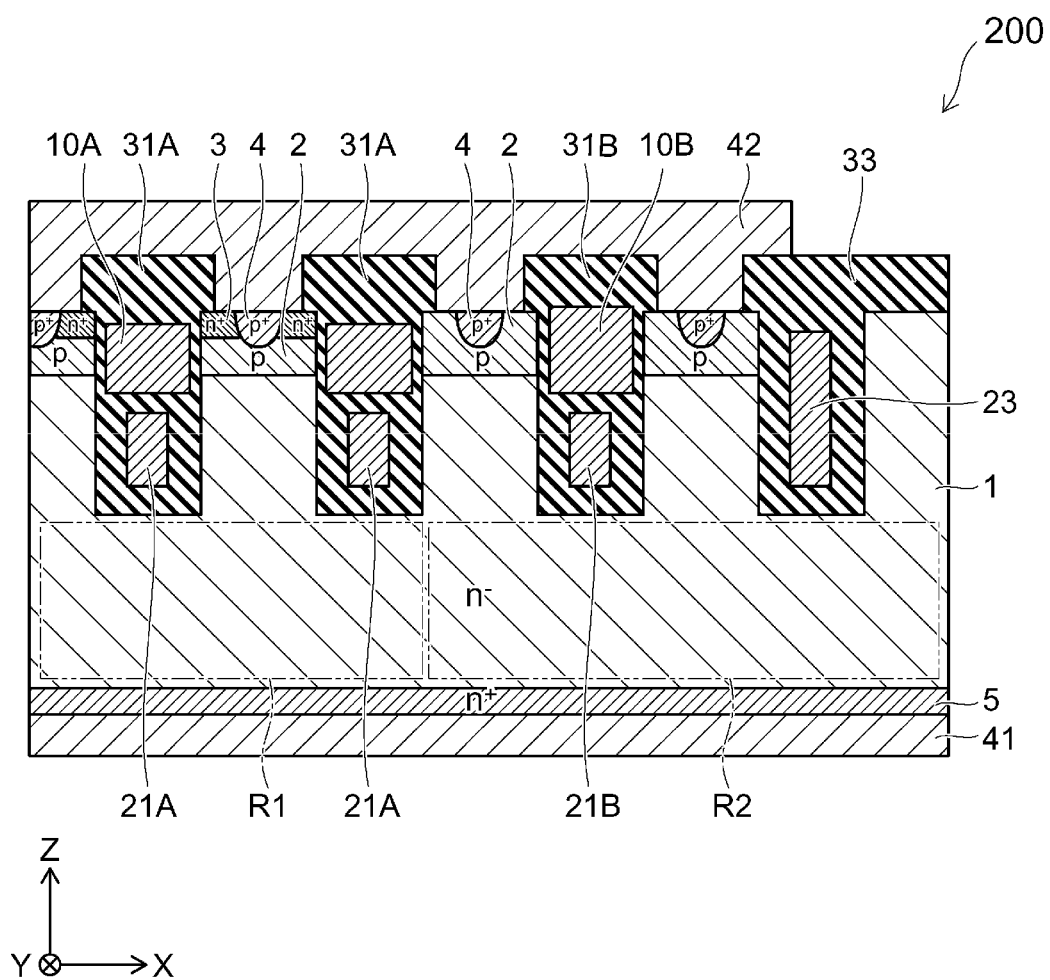
FIG. 14 is a cross-sectional view in which a portion of a semiconductor device according to a second embodiment is enlarged.

FIG. 14 is a cross-sectional view of a portion of a semiconductor device 200 according to a second embodiment.

In the semiconductor device 100, each electrode 10 includes a plurality of portions extending in the Z direction and has a U-shape. In contrast, in the semiconductor device 200, the upper surface of each electrode 10 is approximately flat.

Similarly to the semiconductor device 100, in the semiconductor device 200 also, a plurality of electrodes 10 are aligned in the X direction and a plurality of gate electrodes 10A are provided between the electrodes 10B in the X direction. The upper end of the electrode 10B is positioned higher than the position of the upper end of the gate electrode 10A. The length of the electrode 10B in the Z direction is greater than the length of the gate electrode 10A in the Z direction.

In addition, the electrode 10B is electrically connected to the source electrode 42.

Here, an example of a method of manufacturing the semiconductor device 200 will be described with reference to FIGS. 15A and 15B.

Figure 15A:
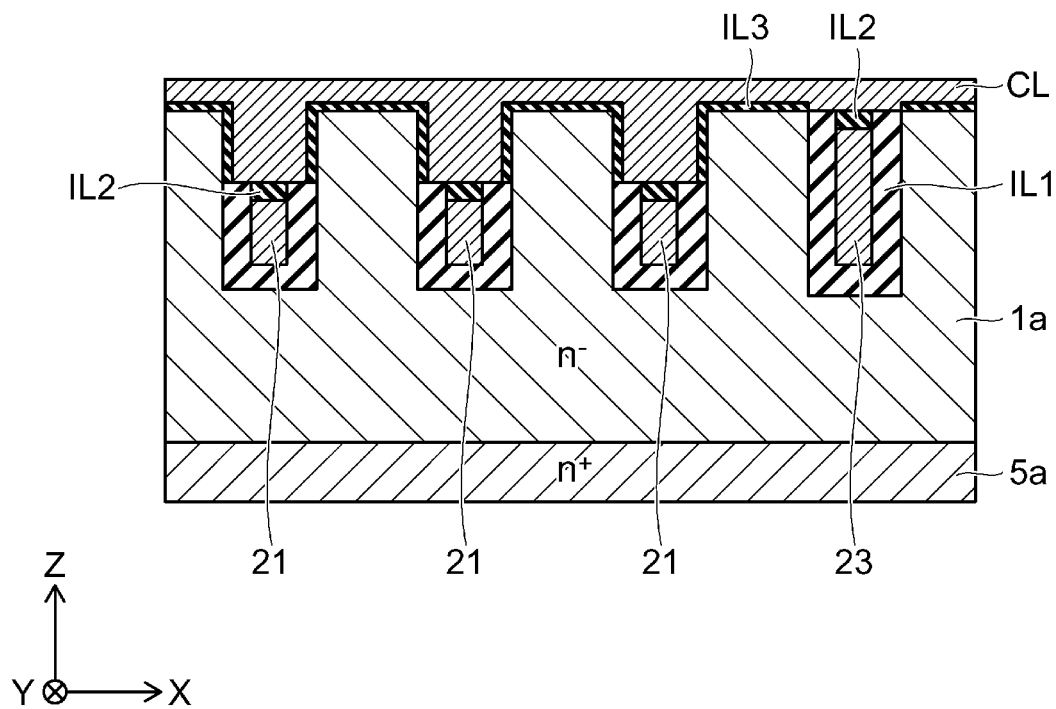
FIGS. 15A and 15B are cross-sectional views illustrating a process of manufacturing the semiconductor device according to the second embodiment.
Figure 15B:
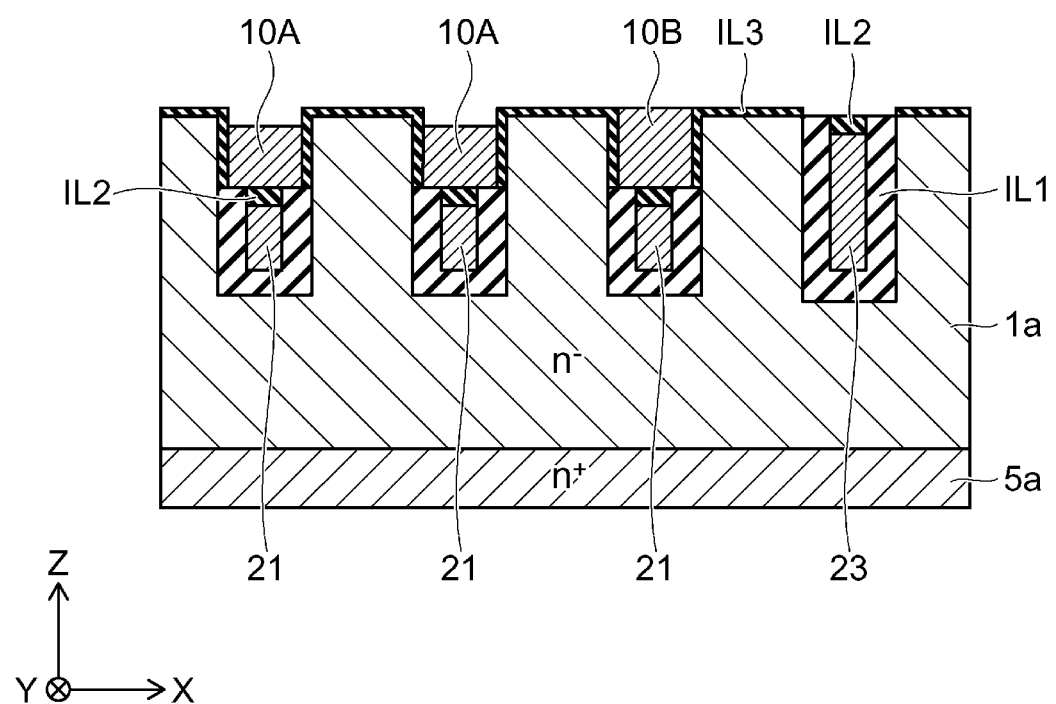

FIGS. 15A and 15B are cross-sectional views illustrating a process of manufacturing the semiconductor device 200 according to the second embodiment.

First, similarly to the process illustrated in FIGS. 7A to 8A, the FP electrode 21 and the insulating layers IL1 to IL3 are formed inside the trenches T. Next, the conductive layer CL is formed on the insulating layer IL3 so as to bury the trenches T. The state at this time is illustrated in FIG. 15A.

Next, by polishing the conductive layer CL using chemical mechanical polishing (CMP), the electrodes 10 are formed inside of each trench T as illustrated in FIG. 15B. Subsequently, similarly to the process illustrated in FIG. 9B, the p-type base region 2, the n⁺-type source region 3, the p+-type contact region 4, and the insulating layer IL4 are formed. Then, similarly to the method of manufacturing the semiconductor device 100, the semiconductor device 200 illustrated in FIG. 14 can be obtained by forming the source electrode 42, the gate pad 43, and the drain electrode 41.

When removing a portion of the conductive layer CL using the CMP in order to form the electrodes 10, there is a case where an amount of polishing on the insulating layer IL3 is less than the amount of polishing of the conductor layer CL as illustrated in FIG. 15B, and the amount of dishing of the conductor CL polishing is greater toward the center of a pattern than at the edge of a pattern. This phenomenon is called dishing. This phenomenon is a problem when the FP electrodes 21 are provided in the trenches T and widths of the trenches T are wide.

As a result, as illustrated in FIG. 14, the position of the upper end of the electrode 10 positioned at the end in the X direction becomes higher than the positions of the upper end of other electrodes 10. In this case, similarly to the first embodiment, the dielectric breakdown in the insulating portion 31 may occur.

Regarding this point, in the present embodiment, the electrode 10B is connected to the source electrode 42. Therefore, similarly to the first embodiment, the possibility of occurrence of the dielectric breakdown in the insulating portion 31B or the occurrence of the leakage current decreases, and thus, it is possible to improve the reliability of the semiconductor device.

In the second embodiment, the structures in each modification example in the first embodiment can be adopted.

For example, similarly to the second modification example of the first embodiment, each FP electrode 21 and each electrode 10 may be integrally provided.

In addition, similarly to the fourth modification example of the first embodiment, a plurality of electrodes 10B adjacent to each other may be provided on the second region R2.

In each embodiment described above, the relative level of impurity concentration between each of the semiconductor regions can be verified using, for example, a scanning capacitance microscope (SCM). A carrier concentration in each of the semiconductor regions can be regarded as equal to the active impurity concentration in each semiconductor region. Therefore, the relative level of carrier concentration between each of the semiconductor regions also can be verified using the SCM.

In addition, the impurity concentration in each of the semiconductor regions can be measured using, for example, a secondary ion mass spectrometry (SIMS).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. For example, specific configurations of each of the n+-type drain region 5, n−-type semiconductor region 1, p-type base region 2, n+-type source region 3, p+-type contact region 4, electrode 10, FP electrode 21, FP electrode 23, insulating portion 31, insulating portion 33, drain electrode 41, source electrode 42, gate pad 43, and the like can be appropriately selected from known technologies by those skilled in the art. The accompanying claims and their equivalents are intended to cover such forms or modifications as would fall within the scope and spirit of the inventions.

What is claimed is:

1. A semiconductor device, comprising:
   a semiconductor layer having a first surface and an opposed second surface, the semiconductor layer comprising:
      a first conductivity type first semiconductor region including a central portion and a peripheral portion; and
      a second conductivity type second semiconductor region selectively on the first semiconductor region in the central portion and the peripheral portion;
   a plurality of first trenches extending inwardly of the first surface, through the second semiconductor region and terminating within the first semiconductor region in the central portion, each first trench comprising:
      a first insulating layer lining the walls and base of the first trench and extending outwardly thereof above the first surface;
      a first electrode in the first trench extending inwardly of the first semiconductor region and spaced therefrom by the first insulating layer; and
      a gate electrode over the first electrode and spaced from adjacent portions of the first semiconductor region and the second semiconductor region by the first insulating layer, and covered by the first insulating layer;
   at least one second trench extending inwardly of the first surface through the second semiconductor region and terminating within the first semiconductor region in the peripheral portion, the second trench comprising:
      a second insulating layer lining the walls and base of the second trench and extending outwardly thereof above the first surface;
      a second electrode in the second trench extending inwardly of the first semiconductor region and spaced therefrom by the second insulating layer; and
      a third electrode over the second electrode and spaced from adjacent portions of the first semiconductor region and the second semiconductor region by the second insulating layer, and covered by the second insulating layer; and
   a fourth electrode overlying the first surface and the first insulating layer in the central portion and the first surface and the second insulating layer in the peripheral portion, wherein
   the third electrode is electrically connected to the fourth electrode.

2. The semiconductor device according to claim 1, wherein at least a portion of the second electrode extends above the first surface.

3. The semiconductor device according to claim 2, wherein the third electrode comprises:
   a first electrode portion extending in a direction from the base of the trench in the direction of the fourth electrode;
   a second electrode portion spaced from the first electrode portion and extending in a direction from the base of the trench in the direction of the fourth electrode; and
   a third electrode portion interconnecting the first and second electrode portions, wherein the length of the second electrode portion extending from the third electrode portion is longer than the length of the first electrode portion extending from the third electrode portion.

4. The semiconductor device according to claim 3, wherein the first electrode portion of the third electrode is interposed between the gate electrode and the second electrode portion of the third electrode.

5. The semiconductor device according to claim 3, wherein the second electrode portion of the third electrode extends above the first surface.

6. The semiconductor device according to claim 4, wherein the portion of the second electrode portion of the third electrode extending above the first surface also extends over a portion of the first surface.

7. The semiconductor device according to claim 1, further comprising:
   a third trench in the peripheral portion extending inwardly of the first surface and terminating in the first semiconductor region, the third trench including a fifth electrode therein extending from a location adjacent to the base of the trench to a location closer to the first surface than the first and second electrodes.

8. The semiconductor device according to claim 1, wherein the second and the third electrodes are connected to the fourth electrode.

9. The semiconductor device according to claim 1, further comprising a gate pad electrode overlying the peripheral portion, wherein the gate electrode is connected to the gate pad electrode.

10. The semiconductor device according to claim 1, wherein the semiconductor layer further comprises a first conductivity type third region interposed between the first semiconductor region and the second surface.

11. The semiconductor device according to claim 1, wherein the semiconductor layer further comprises:
   a second conductivity type fourth semiconductor region interposed between the central portion of the first semiconductor region and the fourth electrode; and
   a first conductivity type fifth semiconductor region interposed between the central portion of the first semiconductor region and the fourth electrode.

* * * * *